(12) United States Patent
Yang et al.

(10) Patent No.: US 9,447,959 B2
(45) Date of Patent: Sep. 20, 2016

(54) HEAT SINK FOR ELECTRICAL ELEMENTS AND LIGHT-EMITTING DEVICE CONTAINING THEREOF

(71) Applicant: Lextar Electronics Corporation, Hsinchu (TW)

(72) Inventors: Li-Cheng Yang, Zhongli (TW); Yu-Chun Lee, Zhubei (TW); Cheng-Ta Kuo, Hsinchu (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 24 days.

(21) Appl. No.: 14/290,971

(22) Filed: May 29, 2014

(65) Prior Publication Data

US 2015/0077996 A1 Mar. 19, 2015

(30) Foreign Application Priority Data

Sep. 14, 2013 (TW) .............................. 102133408 A (51) Int. Cl.
*F21V 29/00* (2015.01)
*F21V 29/85* (2015.01)
*F21V 29/83* (2015.01)
*H01L 23/467* (2006.01)
*H01L 33/64* (2010.01)
*F21Y 101/02* (2006.01)

(52) U.S. Cl.
CPC .............. *F21V 29/85* (2015.01); *F21V 29/83* (2015.01); *H01L 23/467* (2013.01); *H01L 33/648* (2013.01); *F21Y 2101/02* (2013.01); *H01L 2924/0002* (2013.01)

(58) Field of Classification Search
CPC .......... F28F 3/00; F21V 29/83; F21V 29/85; F21Y 2101/02; H01L 23/467; H01L 33/648; H01L 2924/0002
See application file for complete search history.

(56) References Cited

U.S. PATENT DOCUMENTS

| | | | |
|---|---|---|---|
| 8,985,824 B2 * | 3/2015 | Ito .................... | F21S 48/1154 362/542 |
| 2007/0063339 A1 * | 3/2007 | Yao .................... | H01L 23/3672 257/720 |
| 2010/0020563 A1 | 1/2010 | Ito et al. | |

FOREIGN PATENT DOCUMENTS

| | | |
|---|---|---|
| CN | 1144003 C | 3/2004 |
| CN | 101310382 B | 6/2010 |
| CN | 101213660 B | 8/2010 |
| TW | 200706822 A | 2/2007 |
| TW | 201221844 | 6/2012 |

* cited by examiner

*Primary Examiner* — Stephen F Husar
(74) *Attorney, Agent, or Firm* — Moser Taboada (57) ABSTRACT

The disclosure provides a heat sink for electrical elements and a light-emitting device containing thereof. The heat sink includes a radiating substrate and at least one hollow radiating channel. In which, the hollow radiating channel is horizontally embedded in the radiating substrate, and has two openings disposed on the same site or the opposite sites of the radiating substrate, so that gas may flow in the hollow radiating channel and remove heat of the radiating substrate. And a light-emitting device containing the heat sink is also provided.

9 Claims, 7 Drawing Sheets

HEAT SINK FOR ELECTRICAL ELEMENTS AND LIGHT-EMITTING DEVICE CONTAINING THEREOF

RELATED APPLICATIONS

This application claims priority to Taiwan Application Serial Number 102133408 filed Sep. 14, 2013, which is herein incorporated by reference.

BACKGROUND

1. Technical Field

The present disclosure relates to a heat sink, and more particularly, to a heat sink for electrical elements and a light-emitting device containing thereof.

2. Description of Related Art

A general heat sink conducts the heat generated by an electronic device through thermal conductive material making up the heat sink to distribute the heat to a lower temperature portion of the heat sink, and then dissipate the heat into the air by thermal exchange between the air and a surface of the heat sink. In the heat sink, the average temperature of the whole electronic device is commonly deceased by such heat conduction to avoid any thermal damage of the electronic device from overheat.

However, poor thermal conductivity of the heat sink or thermal exchange between the air and the surface of the heat sink may results in heat accumulation in the electronic device which overheats and fails the electronic device.

Therefore, there is a need for an improved heat sink and a light-emitting device containing thereof, so as to solve the aforementioned problems met in the art.

SUMMARY

The present disclosure provides a heat sink for electrical elements and a light-emitting device containing thereof, to solve the problems met in the art.

One embodiment of the present disclosure is to provide a heat sink for electrical elements. The heat sink comprises a thermal conductive substrate and at least one hollow ventilation channel. The hollow ventilation channel is horizontally embedded in the thermal conductive substrate, and has two openings respectively on the same side or two different sides of the thermal conductive substrate, so that air can flow in the hollow ventilation channel and take away the heat of the thermal conductive substrate.

According to one embodiment of the present disclosure, the heat sink further comprises a composite material layer which is formed on the inner wall of the hollow ventilation channel.

According to one embodiment of the present disclosure, the composite material layer comprises a porous material or a hygroscopic material.

According to one embodiment of the present disclosure, the composite material layer comprises a carbonaceous material, a polymer, a metal oxide or a combination thereof.

According to one embodiment of the present disclosure, the heat sink of further comprises a roughened surface which is formed on the inner wall of the hollow ventilation channel.

According to one embodiment of the present disclosure, the material of the thermal conductive substrate includes ceramics, metals or silicon materials.

According to one embodiment of the present disclosure, the thermal conductive substrate is a copper substrate or a silicon substrate.

According to one embodiment of the present disclosure, the two different sides of the thermal conductive substrate are two opposite sides or two adjacent sides.

Another embodiment of the present disclosure is to provide a light-emitting device. The light-emitting device comprises the aforementioned heat sink and at least one light-emitting element positioned on the heat sink.

According to one embodiment of the present disclosure, the light-emitting element is a light-emitting diode.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

The embodiments of the transparent conductive structure and a method for manufacturing the same of the present disclosure are discussed in detail below, but not limited the scope of the present disclosure. The same symbols or numbers are used to the same or similar portion in the drawings or the description. And the applications of the present disclosure are not limited by the following embodiments and examples which the person in the art can apply in the related field.

The singular forms "a," "an" and "the" used herein include plural referents unless the context clearly dictates otherwise. Therefore, reference to, for example, a metal layer includes embodiments having two or more such metal layers, unless the context clearly indicates otherwise. Reference throughout this specification to "one embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, the figures are intended; rather, these figures are intended for illustration.

Figure 1A:
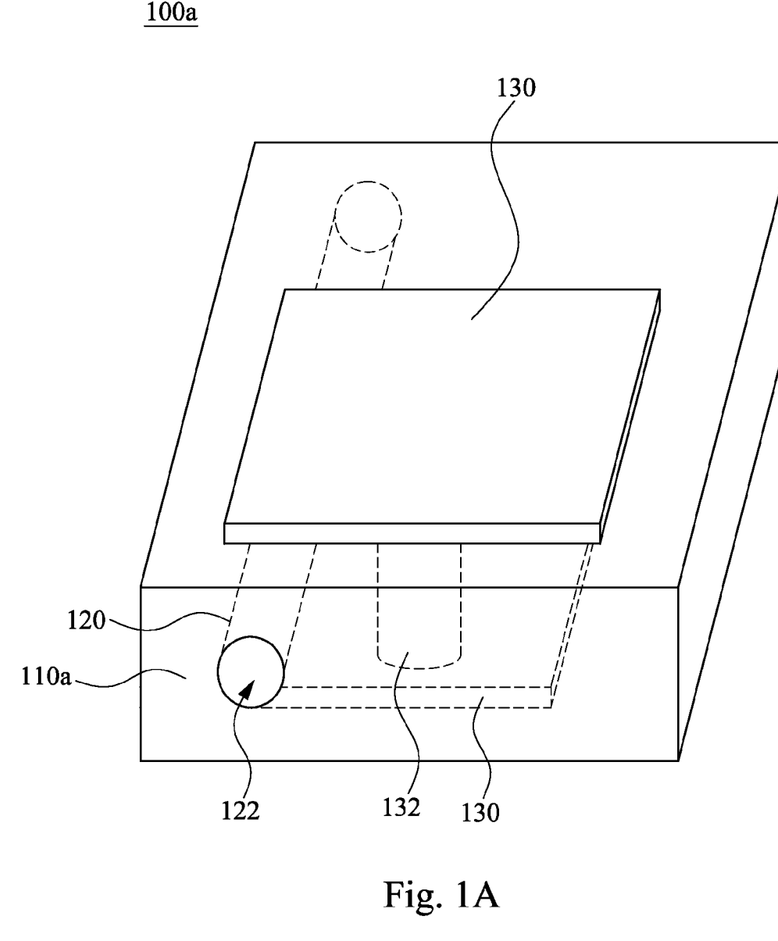
FIG. 1A is a three-dimensional view of a heat sink 100a according to one embodiment of the present disclosure.

FIG. 1A is a three-dimensional view of a heat sink 100a according to one embodiment of the present disclosure. In FIG. 1A, the heat sink 100a comprises a thermal conductive substrate 110a and a hollow ventilation channel 120 horizontally positioned in the thermal conductive substrate 110a. The hollow ventilation channel 120 has two openings 122, and the two openings 122 are respectively on two different sides of the thermal substrate 110a. Therefore, air may flow in the hollow ventilation channel 120 and take away the heat of the thermal conductive substrate 110a.

In FIG. 1A, the two openings 122 of the hollow ventilation channel 120 are respectively on the opposite sides of the thermal conductive substrate 110a. The top surface and the bottom surface of the thermal conductive substrate may further comprise a plurality of metal electrodes and a plurality of conductive pillars electrically connected to the metal electrodes. In one embodiment of the present disclosure, the top surface and the bottom surface of the thermal conductive substrate 110a respectively have metal electrodes 130, and the metal electrodes 130 are electrically connected by a conductive pillar 132, as shown in FIG. 1A.

According to one embodiment of the present disclosure, the material of the thermal conductive substrate includes ceramics, metals or silicon materials. According to another embodiment of the present disclosure, the thermal conductive substrate is a copper substrate or a silicon substrate.

Figure 1B:
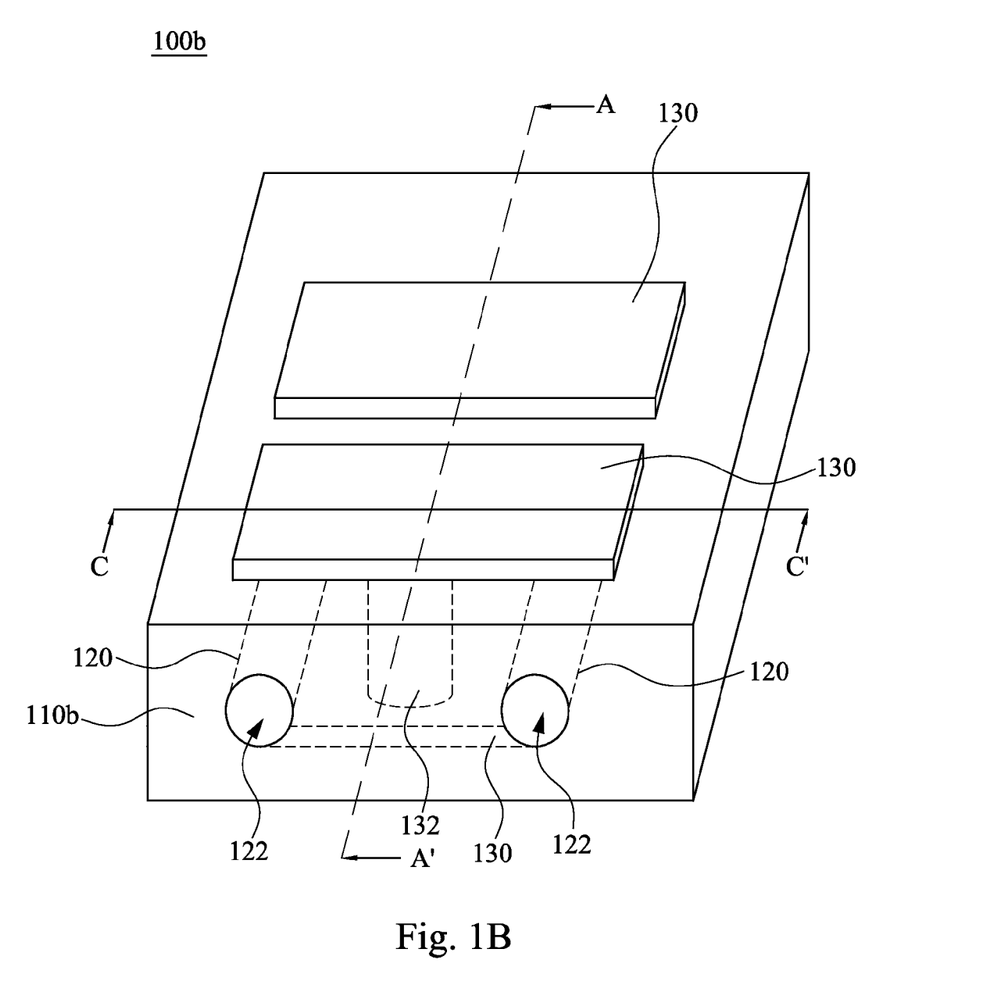
FIG. 1B is a three-dimensional view of a heat sink 100b according to one embodiment of the present disclosure.

FIG. 1B is a three-dimensional view of a heat sink 100b according to one embodiment of the present disclosure. In FIG. 1B, the heat sink 100b comprises a thermal conductive substrate 110b and two hollow ventilation channels 120 parallel to each other and horizontally positioned in the thermal conductive substrate 110b. Each one of the hollow ventilation channels 120 has two openings 122, and the two openings 122 are respectively on opposite sides of the thermal substrate 110b. Therefore, air may flow in the hollow ventilation channels 120 and take away the heat of the thermal conductive substrate 110b. In one embodiment of the present disclosure, the heat sink has a thermal conductive substrate and a U-shaped hollow ventilation channel, wherein the U-shaped hollow ventilation channel has two openings on the same side of the thermal conductive substrate.

Further, in one embodiment of the present disclosure, the top surface and the bottom surface of the thermal conductive substrate 110b respectively have metal electrodes 130, and the metal electrodes 130 are electrically connected by a conductive pillar 132, as shown in FIG. 1B. In one embodiment of the present disclosure, a light-emitting device comprises a heat sink and at least one light-emitting element on the heat sink. In one embodiment of the present disclosure, the light-emitting element may be bonded on the thermal conductive substrate and electrically connected to the metal electrode. In which, the light-emitting element may be a light-emitting diode.

Figure 1C:
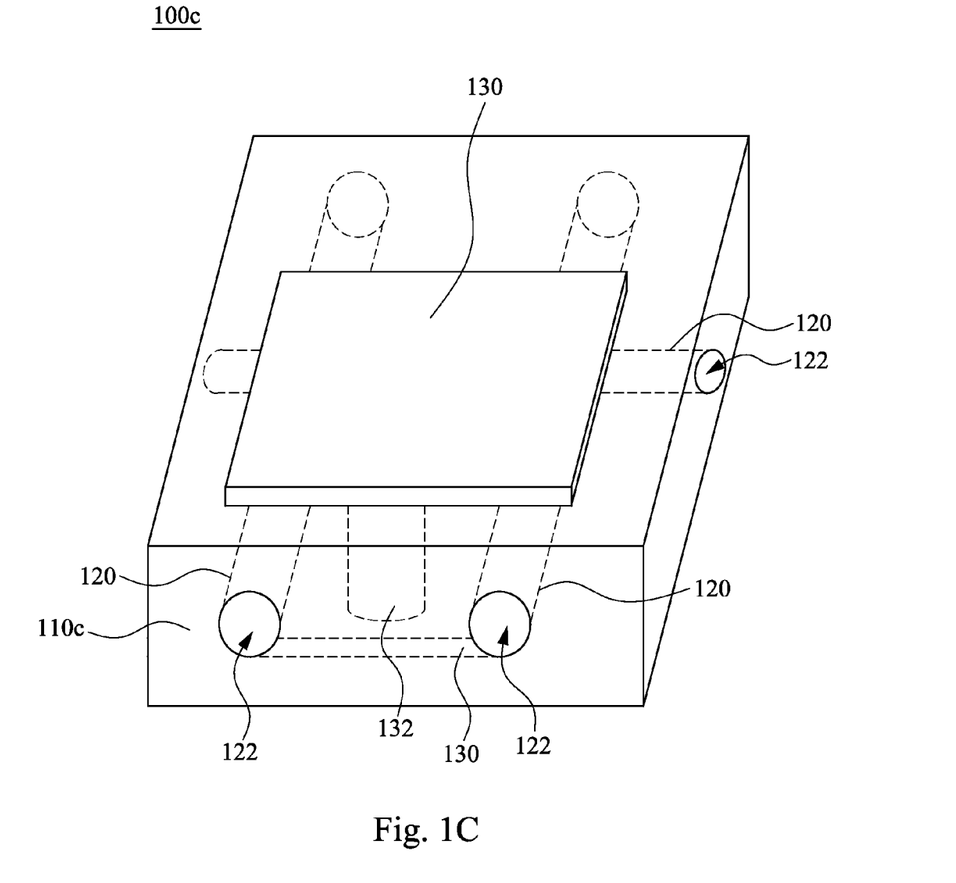
FIG. 1C is a three-dimensional view of a heat sink 100c according to one embodiment of the present disclosure.

FIG. 1C is a three-dimensional view of a heat sink 100c according to one embodiment of the present disclosure. In FIG. 1C, the heat sink 100c comprises a thermal conductive substrate 110c and three hollow ventilation channels 120 horizontally positioned in the thermal conductive substrate 110c. Each one of the hollow ventilation channels 120 has two openings 122, and the two openings 122 are respectively on opposite sides of the thermal substrate 110c. Therefore, air may flow in the hollow ventilation channels 120 and take away the heat of the thermal conductive substrate 110c.

In FIG. 1C, two of the hollow ventilation channels 120 are parallel to each other, and the other hollow ventilation channel 120 is crisscrossed to the two hollow ventilation channels 120, so as to increase the opportunity and direction of air flow. Further, in one embodiment of the present disclosure, the top surface and the bottom surface of the thermal conductive substrate 110c respectively have metal electrodes 130, and the metal electrodes 130 are electrically connected by a conductive pillar 132, as shown in FIG. 1C.

Figure 1D:
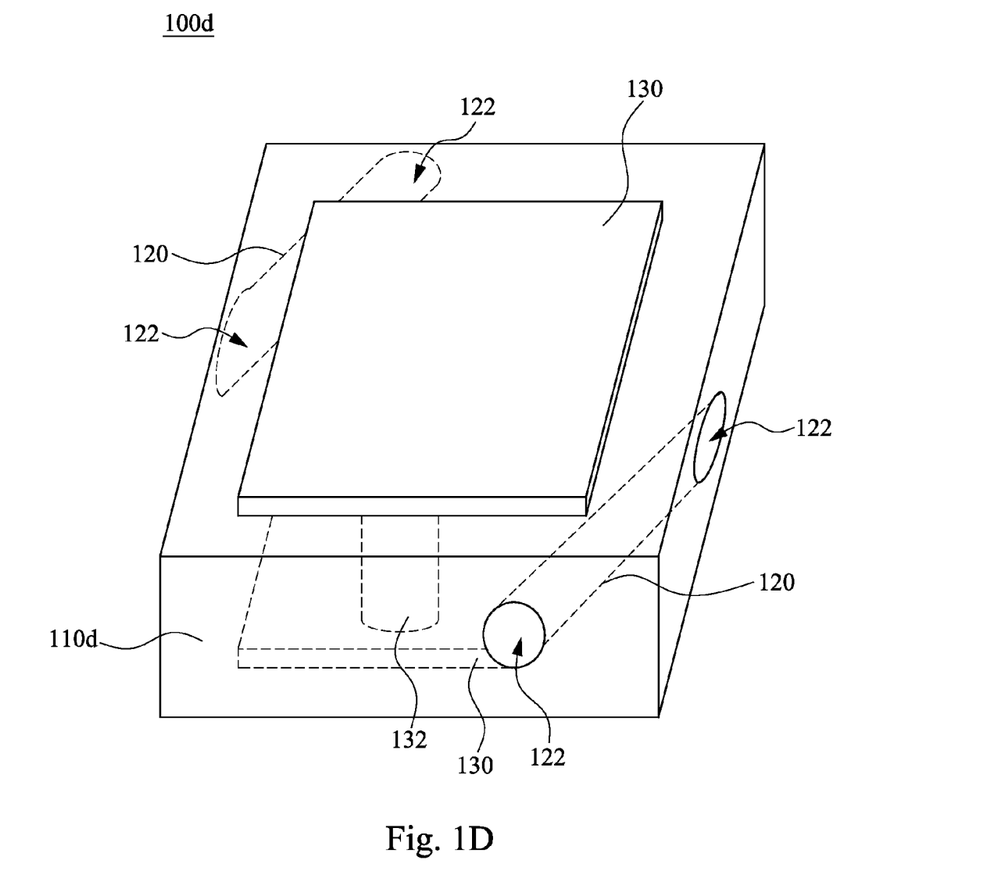
FIG. 1D is a three-dimensional view of a heat sink 100d according to one embodiment of the present disclosure.

FIG. 1D is a three-dimensional view of a heat sink 100d according to one embodiment of the present disclosure. In FIG. 1D, the heat sink 100d comprises a thermal conductive substrate 110d and two hollow ventilation channels 120 horizontally positioned in the thermal conductive substrate 110d. Each one of the hollow ventilation channels 120 has two openings 122, and the two openings 122 are respectively on opposite sides of the thermal substrate 110d. Therefore, air may flow in the hollow ventilation channels 120 and take away the heat of the thermal conductive substrate 110d.

Different from FIG. 1B, the hollow ventilation channels 120 in FIG. 1D are positioned on a slant in the thermal conductive substrate 110d, thus the two openings 122 of the hollow ventilation channels 120 are on the adjacent sides of the thermal conductive substrate 110d. Further, in one embodiment of the present disclosure, the top surface and the bottom surface of the thermal conductive substrate 110d respectively have metal electrodes 130, and the metal electrodes 130 are electrically connected by a conductive pillar 132, as shown in FIG. 1D.

Figure 1E:
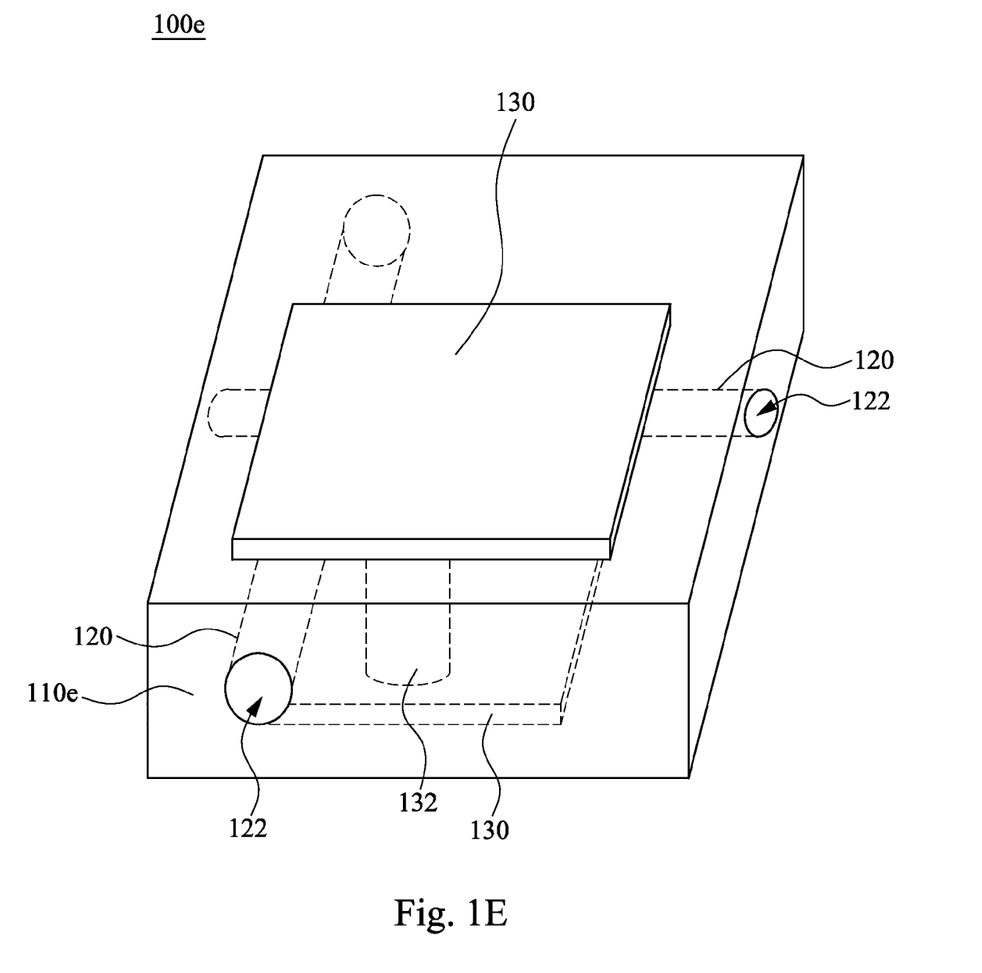
FIG. 1E is a three-dimensional view of a heat sink 100e according to one embodiment of the present disclosure.

FIG. 1E is a three-dimensional view of a heat sink 100e according to one embodiment of the present disclosure. In FIG. 1E, the heat sink 100e comprises a thermal conductive substrate 110e and two hollow ventilation channels 120 horizontally positioned in the thermal conductive substrate 110e. Each one of the hollow ventilation channels 120 has two openings 122, and the two openings 122 are respectively on opposite sides of the thermal substrate 110e. Therefore, air may flow in the hollow ventilation channels 120 and take away the heat of the thermal conductive substrate 110e.

In FIG. 1E, the two hollow ventilation channels 120 are crisscrossed to each other to increase the opportunity and direction of air flow. Further, in one embodiment of the present disclosure, the top surface and the bottom surface of the thermal conductive substrate 110e respectively have metal electrodes 130, and the metal electrodes 130 are electrically connected by a conductive pillar 132, as shown in FIG. 1E.

Figure 2A:
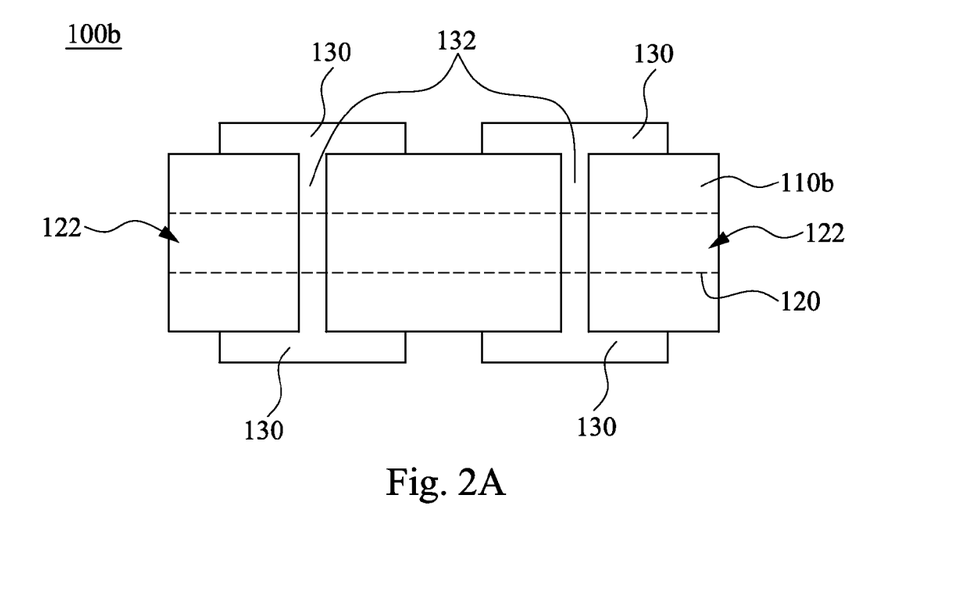
FIG. 2A is a schematic cross-sectional view of the heat sink 100b taken along the line A-A' of FIG. 1B.

FIG. 2A is a schematic cross-sectional view of the heat sink 100b taken along the line A-A' of FIG. 1B. In FIG. 2A, the hollow ventilation channels 120 are horizontally positioned in the thermal conductive substrate 110b, having two openings 122 respectively on opposite sides of the thermal substrate 110b. Further, the metal electrodes 130 are individually positioned on the top surface and the bottom surface of the heat sink 100b. In which, a metal electrode 130 on the top surface and a metal electrode 130 on the bottom surface may pair up and be electrically connected by a conductive pillar 132.

Figure 2B:
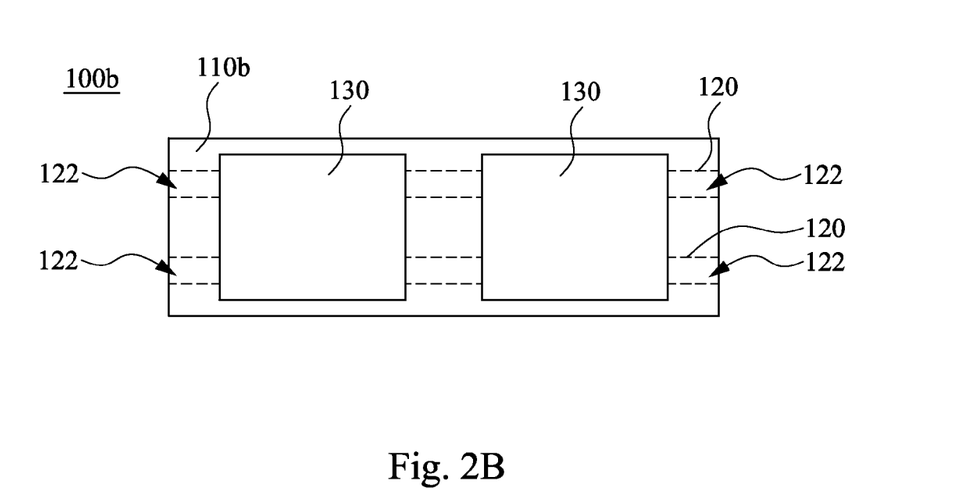
FIG. 2B is the top view of the heat sink 100b of FIG. 2B.

FIG. 2B is the top view of the heat sink 100b of FIG. 2B. In FIG. 2B, the two hollow ventilation channels 120 are parallel to each other and positioned in the thermal conductive substrate 110b. Each one of the hollow ventilation channels 120 has two openings 122 respectively on opposite sides of the thermal conductive substrate 110b. In one embodiment of the present disclosure, the hollow ventilation channels 120 are under the metal electrodes 130, so as to fully absorb the heat generated by electronic elements to enhance the ventilation performance.

Figure 2C:
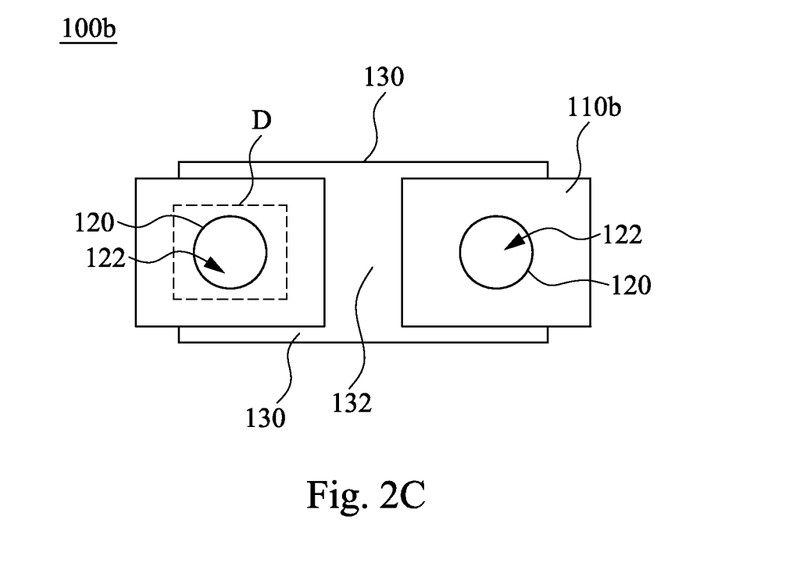
FIG. 2C is a schematic cross-sectional view of the heat sink 100b taken along the line C-C' of FIG. 1B.

FIG. 2C is a schematic cross-sectional view of the heat sink 100b taken along the line C-C' of FIG. 1B. In FIG. 2C, the hollow ventilation channels 120 are under the metal electrodes 130, so as to fully absorb the heat generated by electronic elements to enhance the ventilation performance. Further, the metal electrodes 130 are individually positioned on the top surface and the bottom surface of the heat sink 100*b*. In which, a metal electrode 130 on the top surface and a metal electrode 130 on the bottom surface may pair up and be electrically connected by a conductive pillar 132.

Figure 3A:
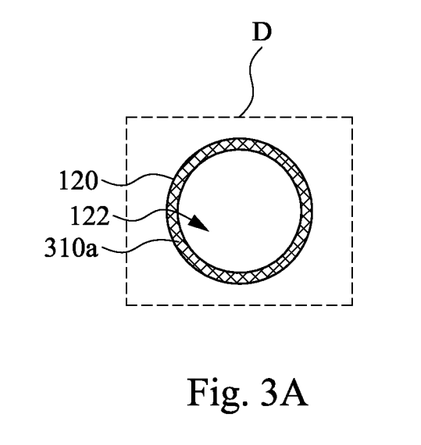
FIG. 3A is an enlarged view of a hollow ventilation channel 120 of the region D in FIG. 2C.

FIG. 3A is an enlarged view of a hollow ventilation channel 120 of the region D in FIG. 2C. In FIG. 3A, the inner wall of the hollow ventilation channels 120 further comprises a composite material layer 310*a*. In one embodiment of the present disclosure, the composite material layer 310*a* comprises a porous material or a hygroscopic material.

The porous material has greater specific area which may significantly enhance the heat exchanging efficiency between the heat sink and air, so as to increase the ventilation performance. On another way, when the hygroscopic material is used to absorb water vapor in air, the temperature of the heat sink may change gradually because of the high specific heat of water. Further, water has higher heat of evaporation, so that the heat of the heat sink may be more absorbed as evaporation of water. In one embodiment of the present disclosure, the composite material layer 310*a* includes a carbonaceous material, a polymer, a metal oxide or a combination thereof.

Figure 3B:
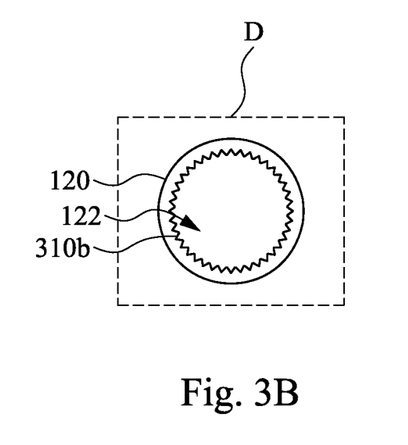
FIG. 3B is an enlarged view of a hollow ventilation channel 120 of the region D in FIG. 2C.

FIG. 3B is an enlarged view of a hollow ventilation channel 120 of the region D in FIG. 2C. In FIG. 3B, the inner wall of the hollow ventilation channels 120 further comprises a roughened surface 310*b*. The inner wall of the hollow ventilation channel 120 is roughened by a roughening process to generate a roughened surface 310*b*. Compared with a smooth surface, the roughened surface has a greater specific area which may increase the heat exchanging efficiency between the heat sink and air and enhance the performance of ventilation.

In embodiments of the present disclosure, the heat sink has at least one hollow ventilation channel which may significantly enhance the heat exchanging efficiency between the heat sink and air, so as to increase the ventilation performance. Further, the hollow ventilation channel is horizontally positioned in the thermal conductive substrate, and has exposed openings keeping the air in circulation.

Although embodiments of the present disclosure and their advantages have been described in detail, they are not used to limit the present disclosure. It should be understood that various changes, substitutions and alterations can be made herein without departing from the spirit and scope of the present disclosure. Therefore, the protecting scope of the present disclosure should be defined as the following claims.

What is claimed is:

1. A heat sink for electrical elements, comprising:
a thermal conductive substrate; and
at least one hollow ventilation channel horizontally embedded in the thermal conductive substrate, the hollow ventilation channel having a roughened surface formed on the inner wall of the hollow ventilation channel and two openings respectively on the same side or two different sides of the thermal conductive substrate, so as to flow air in the hollow ventilation channel and take away the heat of the thermal conductive substrate.

2. The heat sink of claim 1, further comprising a composite material layer formed on the inner wall of the hollow ventilation channel.

3. The heat sink of claim 2, wherein the composite material layer comprises a porous material or a hygroscopic material.

4. The heat sink of claim 3, wherein the composite material layer comprises a carbonaceous material, a polymer, a metal oxide or a combination thereof.

5. The heat sink of claim 1, wherein the material of the thermal conductive substrate includes ceramics, metals or silicon materials.

6. The heat sink of claim 5, wherein the thermal conductive substrate is a copper substrate or a silicon substrate.

7. The heat sink of claim 1, wherein the two different sides of the thermal conductive substrate are two opposite sides or two adjacent sides.

8. A light-emitting device, comprising:
the heat sink of claim 1; and
at least one light-emitting element positioned on the heat sink.

9. The light-emitting device of claim 8, wherein the light-emitting element is a light-emitting diode.

* * * * *